United States Patent
Chun et al.

(10) Patent No.: US 9,130,188 B2
(45) Date of Patent: Sep. 8, 2015

(54) ORGANIC LIGHT-EMITTING DIODE AND FLAT DISPLAY DEVICE INCLUDING THE SAME

(75) Inventors: Byung-Hoon Chun, Yongin (KR); Sung-Jun Bae, Yongin (KR); Seong-Jong Kang, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 787 days.

(21) Appl. No.: 13/290,036

(22) Filed: Nov. 4, 2011

(65) Prior Publication Data
US 2013/0001523 A1     Jan. 3, 2013

(30) Foreign Application Priority Data
Jun. 30, 2011   (KR) .................. 10-2011-0065139

(51) Int. Cl.
*H01L 51/50*   (2006.01)
*H01L 51/00*   (2006.01)

(52) U.S. Cl.
CPC ......... *H01L 51/5096* (2013.01); *H01L 51/0081* (2013.01); *H01L 2251/552* (2013.01)

(58) Field of Classification Search
None
See application file for complete search history.

(56) References Cited

U.S. PATENT DOCUMENTS

| 7,431,997 | B2 | 10/2008 | Hwang et al. | |
|---|---|---|---|---|
| 7,583,020 | B2 | 9/2009 | Yamazaki | |
| 2006/0216546 | A1* | 9/2006 | Tada | 428/690 |
| 2007/0090362 | A1* | 4/2007 | Ahn et al. | 257/66 |
| 2007/0236136 | A1* | 10/2007 | Jou et al. | 313/504 |
| 2008/0180023 | A1 | 7/2008 | Tobise et al. | |

FOREIGN PATENT DOCUMENTS

| JP | 2006-024644 | | 1/2006 | |
|---|---|---|---|---|
| JP | 2007-180277 | * | 7/2007 | ............. H01L 51/50 |
| JP | 2008-108710 | | 5/2008 | |
| JP | 2010-187014 | | 8/2010 | |
| KR | 1020060134382 A | | 12/2006 | |
| KR | 10-2007-0114669 | | 12/2007 | |

* cited by examiner

*Primary Examiner* — Gregory Clark
(74) *Attorney, Agent, or Firm* — Christie, Parker & Hale, LLP

(57) ABSTRACT

An organic light-emitting diode includes: a substrate; a first electrode; a second electrode; an emission layer between the first electrode and the second electrode; and a hole blocking layer between the emission layer and the second electrode. The hole blocking layer includes a first layer including a first material and a second material, and a second layer formed on the first layer and including the first material. The first material includes a hole blocking material having a highest occupied molecular orbital (HOMO) energy level in the range of about 5.5 to about 6.9 eV, and the second material includes a green or red phosphorescent host material.

19 Claims, 3 Drawing Sheets

ORGANIC LIGHT-EMITTING DIODE AND FLAT DISPLAY DEVICE INCLUDING THE SAME

CROSS-REFERENCE TO RELATED PATENT APPLICATION

This application claims priority to and the benefit of Korean Patent Application No. 10-2011-0065139, filed on Jun. 30, 2011 in the Korean Intellectual Property Office, the entire content of which is incorporated herein by reference.

BACKGROUND

1. Technical Field

The present invention relates to an organic light-emitting diode including a multi-layered electron transport layer and a flat display device including the same.

2. Description of Related Art

Organic light-emitting diodes (OLEDs) are self-emitting devices, and have advantages such as a wide viewing angle, good contrast, quick response times, high brightness, and good driving voltage characteristics. Also OLEDs can provide multicolored images.

In general, an OLED has a structure including a substrate, and an anode, a hole transport layer (HTL), an emission layer (EML), an electron transport layer (ETL), and a cathode are sequentially stacked on the substrate. In this regard, the HTL, the EML, and the ETL are organic layers formed of organic compounds. When a voltage is applied between the anode and the cathode, holes injected from the anode move to the EML via the HTL, and electrons injected from the cathode move to the EML via the ETL. The holes and electrons recombine in the EML to generate excitons. When the excitons drop from the excited state to the ground state, light is emitted.

When the EML of the OLED includes a phosphorescent dopant, a hole blocking layer (HBL) may be formed on the EML to prevent triplet excitons or holes from being diffused into the ETL. The HBL is formed of a hole blocking material, and prevents holes from being diffused into the ETL, thereby enhancing the efficiency of the OLED. However, the driving voltage and lifetime of the OLED may be reduced.

SUMMARY OF THE INVENTION

In embodiments of the present invention, reducing the interface barrier of the hole blocking layer yields an organic light-emitting diode with high efficiency and a long lifetime.

According to an aspect of the present invention, an organic light-emitting diode includes: a substrate; a first electrode; a second electrode; an emission layer between the first electrode and the second electrode; and a hole blocking layer between the emission layer and the second electrode. The hole blocking layer includes a first layer including a first material and a second material, and a second layer formed on the first layer and including the first material. The first material includes a hole blocking material having a highest occupied molecular orbital (HOMO) energy level in a range of about 5.5 to about 6.9 eV, and the second material includes a green or red phosphorescent host material.

The first material may include at least one selected from 2-biphenyl-4-yl-5-(4-t-butylphenyl)-1,3,4-oxadiazole (PBD), 3-phenyl-4-(1'-naphthyl)-5-phenyl-1,2,4-triazole (TAZ), 2,9-dimethyl-4,7-diphenyl-1,10-phenanthroline (BCP), 2,2',2''-(1,3,5-benzenetriyl)tris[1-phenyl-1H-benzimidazole] (TPBI), N-2,6-dibromophenyl-1,8-naphthalimide (niBr), bis(2-methyl-8-quinolato)-(p-phenylphenolato)-aluminum (Balq), aluminium(III)bis(2-methyl-8-quinolinolato)-4-phenolate (Palq), and aluminium(III)bis(2-methyl-8-quinolinolato)triphenylsilanolate (Salq).

The second material may include at least one selected from carbazole derivatives, phenanthroline derivatives, triazole derivatives, and quinolinolato-based metal complexes.

The second material may include at least one selected from 4,4-N,N'-dicarbazole-biphenyl (CBP), N,N'-dicarbazolyl-3,5-benzene (mCP), 4,4',4''-tris(9-carbazolyl)triphenylamine, 4,4'-bis(9-carbazolyl)-2,2'-dimethylbiphenyl, 3-phenyl-4-(1'-naphthyl)-5-phenylcarbazole, and 2,9-dimethyl-4,7-diphenyl-1,10-phenanthroline (BCP).

The thicknesses of the first layer and the second layer may each be independently in a range of about 5 Å to about 200 Å.

An amount of the first material in the first layer may be in a range of about 30 to about 70 parts by weight based on 100 parts by weight of the first layer, and an amount of the second material in the first layer may be in a range of about 30 to about 70 parts by weight based on 100 parts by weight of the first layer.

A concentration of the first material in the first layer may decrease towards the first electrode and increase towards the second electrode.

A concentration of the second material in the first layer may increase towards the first electrode and decrease towards the second electrode.

The organic light-emitting diode may further include at least one layer selected from a hole injection layer, a hole transport layer, an electron transport layer, and an electron injection layer, and the at least one layer may be formed between the first electrode and the second electrode.

The organic light-emitting diode may further include a third layer formed on the second layer and comprising the first material, a third material, and a fourth material, wherein the third material includes at least one of Compound 1 below, a compound represented by Formula 1 below, and a compound represented by Formula 2 below, and the fourth material includes an electron injection material:

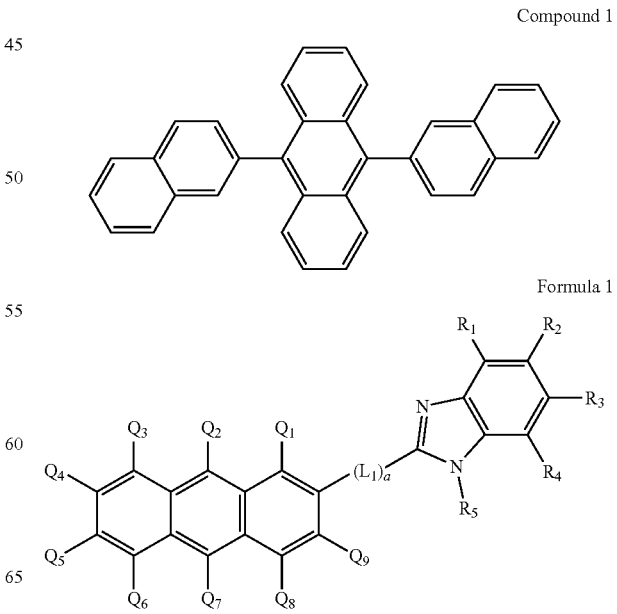

Compound 1

Formula 1

-continued

Formula 2

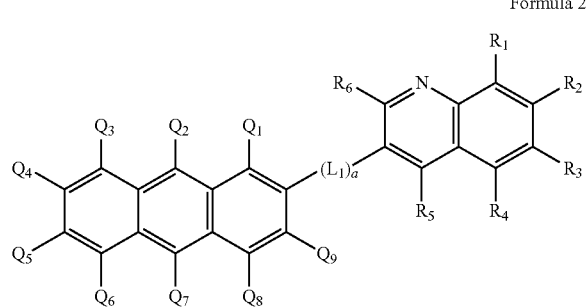

A description of $R_1$ through $R_6$, $L_1$, $Q_1$ through $Q_9$, and a will be provided later in the detailed description.

The fourth material may include at least one selected from LiQ, LiF, NaCl, CsF, $Li_2O$, BaO, and $BaF_2$.

The first layer, the second layer, and the third layer may each have a thickness in the range of about 3 Å to about 150 Å.

An amount of the first material in the first layer may be in the range of about 30 to about 70 parts by weight based on 100 parts by weight of the first layer. An amount of the second material in the first layer may be in the range of about 30 to about 70 parts by weight based on 100 parts by weight of the first layer. An amount of the first material in the third layer may be in the range of about 30 to about 70 parts by weight based on 100 parts by weight of the third layer. An amount of the third material in the third layer may be in the range of about 15 to about 35 parts by weight based on 100 parts by weight of the third layer. An amount of the fourth material in the third layer may be in the range of about 15 to about 35 parts by weight based on 100 parts by weight of the third layer.

A concentration of the first material in the first layer may decrease towards the first electrode and increase towards the second electrode, and a concentration of the first material in the third layer may increase towards the first electrode and decrease towards the second electrode.

A concentration of the second material in the first layer may increase towards the first electrode and decrease towards the second electrode.

A concentration of each of the third material and the fourth material in the third layer decreases towards the first electrode and increases towards the second electrode.

The organic light-emitting diode may further include at least one layer selected from a hole injection layer, a hole transport layer, an electron transport layer, and an electron injection layer, and the at least one layer is formed between the first electrode and the second electrode.

According to another aspect of the present invention, a flat display device includes: a transistor including a source electrode, a drain electrode, a gate electrode, and an active layer; and the organic light-emitting diode described above. One of the source and drain electrodes is electrically connected to a first electrode of the organic light-emitting diode.

BRIEF DESCRIPTION OF THE DRAWINGS

The above and other features and advantages of the present invention will become more apparent by reference to the following detailed description when considered in conjunction with the attached drawings in which.

DETAILED DESCRIPTION OF THE INVENTION

Exemplary embodiments of the present invention will now be described in detail with reference to the accompanying drawings.

Figure 1:
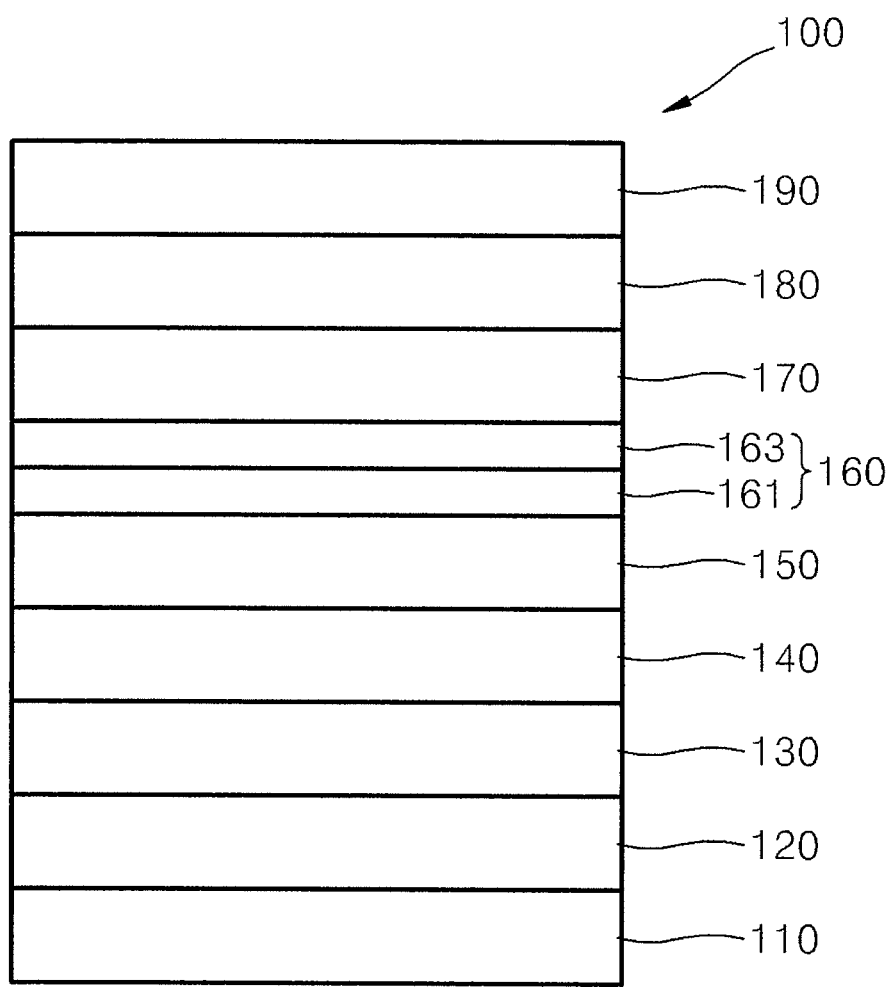
FIG. 1 is a schematic diagram of a structure of an organic light-emitting diode (OLED) according to an embodiment.

FIG. 1 is a schematic diagram of a structure of an organic light-emitting diode (OLED) 100 according to an embodiment.

The OLED 100 includes a substrate 110, and a first electrode 120, a hole injection layer (HIL) 130, a hole transport layer (HTL) 140, an emission layer (EML) 150, a hole blocking layer (HBL) 160, an electron transport layer (ETL) 170, an electron injection layer (EIL) 180, and a second electrode 190 are sequentially stacked on the substrate 110. The HBL 160 includes a first layer 161 including a first material and a second material and a second layer 163 including the first material. The first layer 161 is formed on the EML 150, and the second layer 163 is formed on the first layer 161.

When a phosphorescent dopant is used in the EML 150, an HBL 160 is formed on the EML 150 to prevent triplet excitons or holes from being diffused into the ETL 170. The HBL 160 includes the first layer 161 and the second layer 163. The first layer 161 includes the first material and the second material. In this regard, the first material is a hole blocking material having a highest occupied molecular orbital (HOMO) energy level in the range of about 5.5 to about 6.9 eV, and the second material is a green or red phosphorescent host material.

The first material prevents diffusion of excitons from the EML 150 (which includes a phosphorescent dopant). The first material traps holes passing through the EML 150 or arriving at the HBL 160 at a rapid rate, and reduces the electron injection energy barrier at an interface of the HBL 160.

The first material may be at least one selected from an oxadiazole derivative such as 2-biphenyl-4-yl-5-(4-t-butylphenyl)-1,3,4-oxadiazole (PBD), a triazole derivative such as 3-phenyl-4-(1'-naphthyl)-5-phenyl-1,2,4-triazole (TAZ), a phenanthroline derivative such as 2,9-dimethyl-4,7-diphenyl-1,10-phenanthroline (BCP), 2,2',2"-(1,3,5-benzenetriyl)tris[1-phenyl-1H-benzimidazole] (TPBI), N-2,6-dibromophenyl-1,8-naphthalimide (niBr), bis(2-methyl-8-quinolato)-(p-phenylphenolato)-aluminum (Balq), aluminium(III)bis(2-methyl-8-quinolinolato)-4-phenolate (Palq), and aluminium(III)bis(2-methyl-8-quinolinolato) triphenylsilanolate (Salq).

The second material has a high glass transition temperature, a high pyrolysis temperature, and good electrochemical stability, thereby securing thermal stability from the adjacent EML 150. In addition, the second material has strong adhesive strength with materials of other adjacent layers, and thus prevents interlayer movement.

The second material may be at least one of a carbazole derivative, a phenanthroline derivative, a triazole derivative, and a quinolinolato-based metal complex. Examples of the second material include 4,4-N,N'-dicarbazole-biphenyl (CBP), N,N'-dicarbazolyl-3,5-benzene (mCP), 4,4',4"-tris(9-carbazolyl)triphenylamine, 4,4'-bis(9-carbazolyl)-2,2'-dimethylbiphenyl, 3-phenyl-4-(1-naphthyl)-5-phenylcarbazole, and 2,9-dimethyl-4,7-diphenyl-1,10-phenathroline (BCP).

The first layer 161 is formed by mixing the first and second materials having the properties described above.

The second layer 163 is formed on the first layer 161. The second layer includes the first material, thereby preventing triplet excitons or holes from being diffused into the ETL 170.

Each of the first layer 161 and the second layer 163 may have a thickness in the range of about 5 Å to about 200 Å. When the thickness of each of the first layer 161 and the second layer 163 is about 5 Å or greater, satisfactory hole blocking properties are obtained. On the other hand, when the thickness of each of the first layer 161 and the second layer 163 is 200 Å or less, driving voltage does not significantly increase.

The amount of the first material in the first layer 161 may be in the range of about 30 to about 70 parts by weight based on 100 parts by weight of the first layer 161, and the amount of the second material in the first layer 161 may be in the range of about 30 to about 70 parts by weight based on 100 parts by weight of the first layer 161. When the amount of each of the first and second materials is within this range, satisfactory hole blocking properties and thermal stability are obtained.

The concentration of the first material in the first layer 161 decreases towards the first electrode 120 and increases towards the second electrode 190. Thus, the concentration of the first material in the first layer 161 is nearly zero at a contact surface between the first layer 161 and the EML 150, which is nearest to the first electrode 120, and has a maximum value at a contact surface between the first layer 161 and the second layer 163, which is nearest to the second electrode 190. For example, the concentration of the first material at the contact surface between the first layer 161 and the second layer 163 may be the same as the concentration of the first material of the second layer 163.

In contrast, the concentration of the second material in the first layer 161 increases towards the first electrode 120 and decreases towards the second electrode 190. In other words, the concentration of the second material substantially has a maximum value at the contact surface between the first layer 161 and the EML 150 and is nearly zero at the contact surface between the first layer 161 and the second layer 163.

In addition, since the concentration of the first material at the contact surface between the first layer 161 and the second layer 163 is high, good hole blocking properties are obtained. On the other hand, since the concentration of the second material is low at the contact surface therebetween, thermal stability is relatively low. Since the concentration of the first material is low at the contact surface between the first layer 161 and the EML 150, hole blocking properties are weak. On the other hand, since the concentration of the second material is high at the contact surface therebetween, thermal stability is obtained. In addition, since the concentration of the first material at the contact surface between the first layer 161 and the second layer 163 is high, good hole blocking properties are obtained.

For example, the concentration of the first material in the first layer 161 may increase towards the second electrode 190 as it moves away from the first electrode 120. In addition, the concentration of the second material in the first layer 161 may decrease towards the second electrode 190 as it moves away from the first electrode 120. Such an increase or decrease of concentration may result in a concentration gradient. In the case where the concentration of the first material or the second material is changed, satisfactory hole blocking properties and thermal stability are obtained.

Thus, the HBL 160 including the first layer 161 and the second layer 163 blocks holes and is thermally stable, thereby stabilizing the flow of carriers. Accordingly, an OLED including the structure described above may have high efficiency and a long lifetime.

Figure 2:
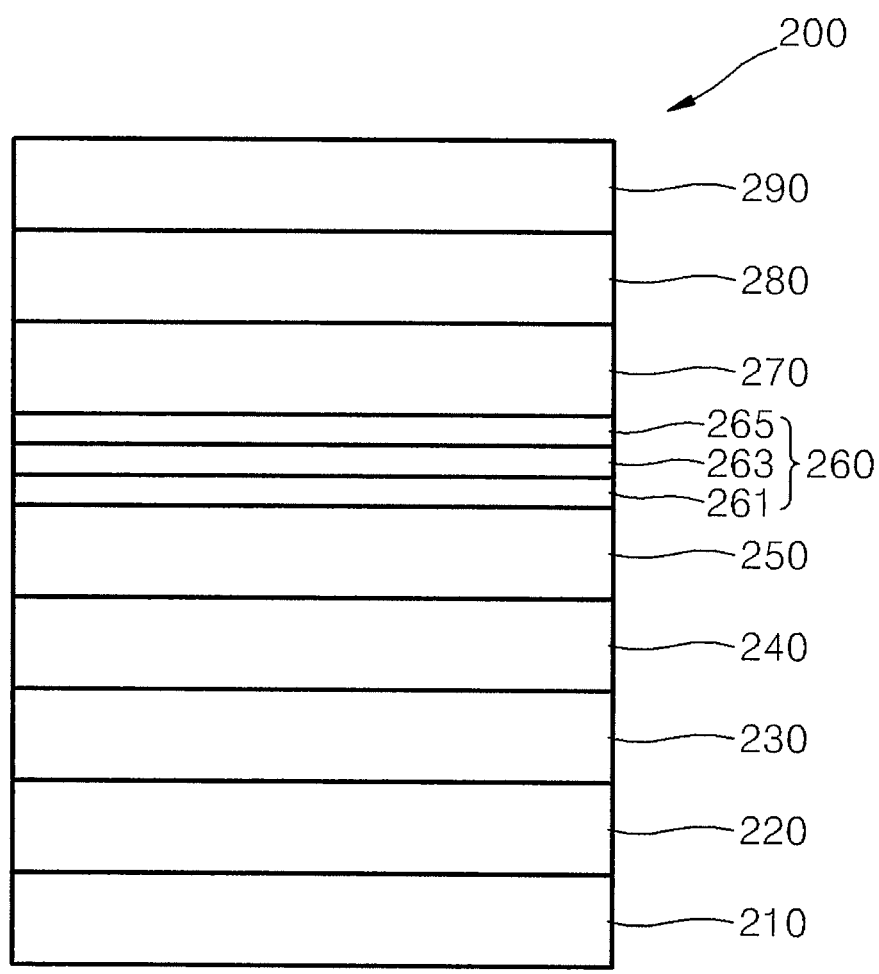
FIG. 2 is a schematic diagram of a structure of an OLED according to another embodiment.

FIG. 2 is a schematic diagram of a structure of an OLED 200 according to another embodiment.

The OLED 200 includes a substrate 210, and a first electrode 220, a HIL 230, a HTL 240, an EML 250, a HBL 260, an ETL 270, an EIL 280, and a second electrode 290 are sequentially stacked on the substrate 210. The HBL 260 includes a first layer 261 including a first material and a second material, a second layer 263 including the first material, and a third layer 265 including the first material, a third material, and a fourth material.

The first layer 261 including the first material and the second material is formed on the EML 250.

The first material, as described above, prevents diffusion of excitons from the EML 250 (which includes a phosphorescent dopant), traps holes passing through the EML 250 or arriving at the HBL 260 at a rapid rate, and reduces the electron injection energy barrier at an interface of the HBL 260. The first material may be at least one selected from an oxadiazole derivative such as 2-biphenyl-4-yl-5-(4-t-butylphenyl)-1,3,4-oxadiazole (PBD), a triazole derivative such as 3-phenyl-4-(1'-naphthyl)-5-phenyl-1,2,4-triazole (TAZ), a phenanthroline derivative such as 2,9-dimethyl-4,7-diphenyl-1,10-phenanthroline (BCP), 2,2',2"-(1,3,5-benzenetriyl) tris[1-phenyl-1H-benzimidazole] (TPBI), N-2,6-dibromophenyl-1,8-naphthalimide (niBr), bis(2-methyl-8-quinolato)-(p-phenylphenolato)-aluminum (Balq), aluminium(III)bis(2-methyl-8-quinolinolato)-4-phenolate (Palq), and aluminium(III)bis(2-methyl-8-quinolinolato) triphenylsilanolate (Salq).

The second material, as described above, secures thermal stability from the adjacent EML 250, and has strong adhesive strength with materials of other adjacent layers, thereby preventing interlayer movement. The second material may be at least one of a carbazole derivative, a phenanthroline derivative, a triazole derivative, and a quinolinolato-based metal complex. Examples of the second material include 4,4-N,N'-dicarbazole-biphenyl (CBP), N,N'-dicarbazolyl-3,5-benzene (mCP), 4,4',4"-tris(9-carbazolyl)triphenylamine, 4,4'-bis(9-carbazolyl)-2,2'-dimethylbiphenyl, 3-phenyl-4-(1'-naphthyl)-5-phenylcarbazole, and 2,9-dimethyl-4,7-diphenyl-1,10-phenathroline (BCP).

The second layer 263 formed of the first material is formed on the first layer 261.

The second layer 263 includes the first material, thereby preventing triplet excitons or holes from being diffused into the third layer 265 from the first layer 261.

The third layer 265 including the first, third and fourth materials is formed on the second layer 263.

The third material is an anthracene derivative having electron transporting ability, and may be at least one of Compound 1 below, a compound represented by Formula 1 below, and a compound represented by Formula 2 below:

Compound 1

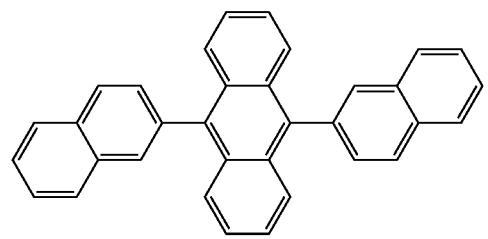

Formula 1

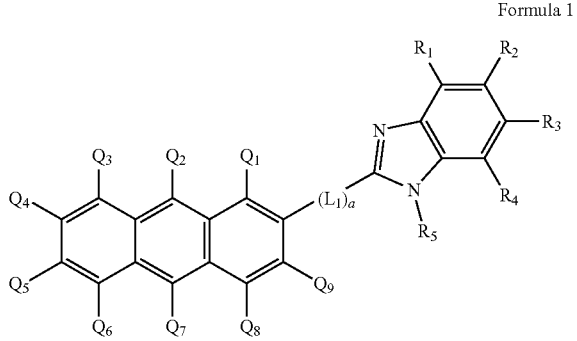

Formula 2

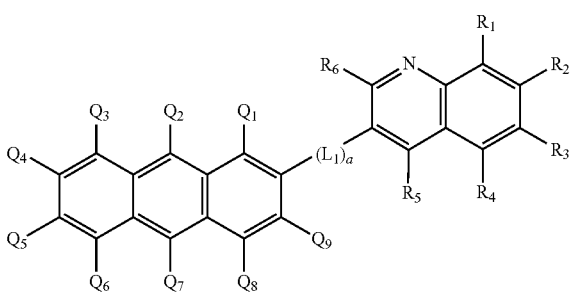

In Formulae 1 and 2, each of $R_1$ through $R_6$ is independently hydrogen, a halogen atom, a hydroxyl group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ heteroaryl group. At least two adjacent R groups may be optionally linked to each other to form a saturated or unsaturated ring. $L_1$ is a single bond, a substituted or unsubstituted $C_1$-$C_{30}$ alkylene group, a substituted or unsubstituted $C_6$-$C_{30}$ arylene group, or a substituted or unsubstituted $C_3$-$C_{30}$ heteroarylene group. Each of $Q_1$ through $Q_9$ is independently hydrogen, a substituted or unsubstituted $C_6$-$C_{30}$ aryl group or a substituted or unsubstituted $C_3$-$C_{30}$ heteroaryl group. Also, a is an integer of 1 to 10.

Nonlimiting examples of substituents for each of $R_1$ through $R_6$ include hydrogen, a halogen atom, a hydroxyl group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, and a pyrazinyl group.

In some embodiments, for example, in Formula 1 above, each of $R_1$ through $R_4$ is hydrogen, and $R_5$ may be one selected from a halogen atom, a hydroxyl group, a cyano group, a methyl group, an ethyl group, a propyl group, a butyl group, a methoxy group, an ethoxy group, a propoxy group, a butoxy group, a phenyl group, a naphthyl group, an anthryl group, a pyridinyl group, and a pyrazinyl group. In addition, in some embodiments, in Formula 2 above, each of $R_1$ through $R_6$ may be hydrogen. However, the present invention is not limited to these.

Nonlimiting examples of substituents for each of $Q_1$ through $Q_9$ include hydrogen, a phenyl group, a naphthyl group, an anthryl group, a pyridinyl group, and a pyrazinyl group. In some embodiments, for example, in Formulae 1 and 2 above, each of $Q_1$, $Q_3$-$Q_6$, $Q_8$ and $Q_9$ is hydrogen, and nonlimiting examples of substituents for each of $Q_2$ and $Q_7$ include a phenyl group, a naphthyl group, an anthryl group, a pyridinyl group, and a pyrazinyl group.

Nonlimiting examples of groups for $L_1$ include a phenylene group, a naphthylene group, an anthrylene group, a pyridinylene group, and a pyrazinylene group. In some embodiments, for example, $L_1$ may be a phenylene group or a pyridinylene group.

In some embodiments, a may be, but is not limited to, an integer of 1, 2, or 3.

In some embodiments, the third material may be at least one of Compounds 1 through 3 below:

Compound 1

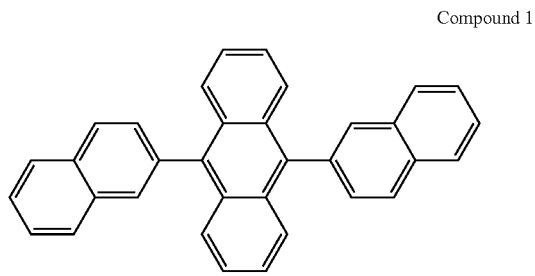

Compound 2

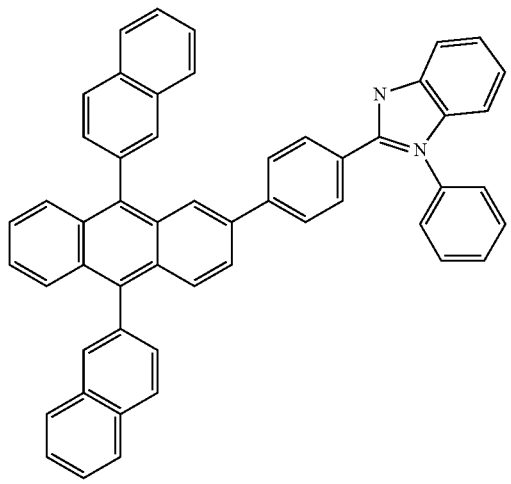

Compound 3

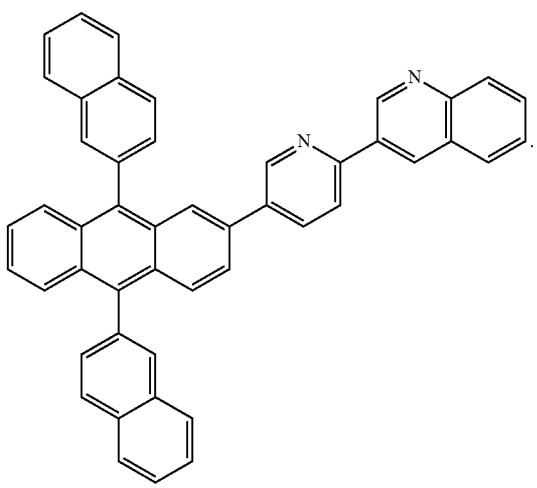

The fourth material is an electron injection material, and may be at least one of LiQ, LiF, NaCl, CsF, $Li_2O$, BaO, and $BaF_2$. The fourth material may also have hole blocking ability.

For example, the fourth material may be LiQ.

The third layer 265 includes the first material, the third material, and the fourth material, thereby appropriately adjusting the injection and transfer of electrons and having a hole blocking effect.

As time passes after the operation of an OLED, the amount of electrons or holes changes, and thus the number of excitons generated in an EML gradually decreases. Accordingly, carrier balance may be lost, which results in a reduction in the lifetime of the OLED. In embodiments of the present invention, however, the HBL 260 includes the first layer 261, the second layer 263, and the third layer 265, and is therefore capable of blocking holes and maintaining the flow of carriers constantly by adjusting the movement rate of electrons. Thus, the OLED may have high efficiency and a long lifetime.

Each of the first layer 261, the second layer 263, and the third layer 265 may have a thickness in the range of about 3 Å to about 150 Å. When the thickness of each of the first layer 261, the second layer 263, and the third layer 265 is 3 Å or greater, satisfactory hole blocking properties and electron injection properties may be obtained. On the other hand, when the thickness of each of the first layer 261, the second layer 263, and the third layer 265 is 150 Å or less, the driving voltage does not increase significantly.

The amount of the first material in the first layer 261 may be in the range of about 30 to about 70 parts by weight based on 100 parts by weight of the first layer 261. The amount of the second material in the first layer 261 may be in the range of about 30 to about 70 parts by weight based on 100 parts by weight of the first layer 261. The amount of the first material in the third layer 265 may be in the range of about 30 to about 70 parts by weight based on 100 parts by weight of the third layer 265. The amount of the third material in the third layer 265 may be in the range of about 15 to about 35 parts by weight based on 100 parts by weight of the third layer 265. The amount of the fourth material in the third layer 265 may be in the range of about 15 to about 35 parts by weight based on 100 parts by weight of the third layer 265. When the amount of each of the first, third and fourth materials is within these ranges, satisfactory hole blocking properties, thermal stability and electron injection properties are obtained.

The concentration of the first material in the first layer 261 decreases towards the first electrode 220 and increases towards the second electrode 290. Thus, the concentration of the first material in the first layer 261 is nearly zero at the contact surface between the first layer 261 and the EML 250, which is nearest to the first electrode 220, and has a maximum value at the contact surface between the first layer 261 and the second layer 263, which is nearest to the second electrode 290. For example, the concentration of the first material at the contact surface between the first layer 261 and the second layer 263 may be the same as the concentration of the first material in the second layer 263. In addition, the concentration of the first material in the third layer 265 increases towards the first electrode 220 and decreases towards the second electrode 290. Thus, the concentration of the first material in the third layer 265 has a maximum value at the contact surface between the third layer 265 and the second layer 263, which is nearest to the first electrode 220, and is nearly zero at the contact surface between the third layer 265 and the ETL 270, which is nearest to the second electrode 290. For example, the concentration of the first material at the contact surface between the third layer 265 and the second layer 263 may be the same as the concentration of the first material in the second layer 263.

In contrast, the concentration of the second material in the first layer 261 increases towards the first electrode 220 and decreases towards the second electrode 290. In other words, the concentration of the second material has a maximum value at the contact surface between the first layer 261 and the EML 250, and is nearly zero at the contact surface between the first layer 261 and the second layer 263.

Meanwhile, the concentration of each of the third material and the fourth material of the third layer 265 is lower towards the first electrode 220 and is higher towards the second electrode 290. In other words, the concentration of each of the third and fourth materials is nearly zero at the contact surface between the third layer 265 and the second layer 263, and has a maximum value at the contact surface between the third layer 265 and the EIL 270.

Since the concentration of the first material of the first layer 261 is low at the contact surface between the first layer 261 and the EML 250, hole blocking properties are weak. On the other hand, since the concentration of the second material of the first layer 261 is high at the contact surface therebetween, thermal stability is obtained. In addition, since the concentration of the first material of the first layer 261 at the contact surface between the first layer 261 and the second layer 263 is high, good hole blocking properties are obtained. Since the concentration of the first material of the third layer 265 is high at the contact surface between the third layer 265 and the second layer 263, hole blocking properties are strong. On the other hand, since the concentration of the first material of the third layer 265 is low at the contact surface between the third layer 265 and the ETL 270, hole blocking properties are weak. In addition, since the concentration of each of the third and fourth materials is high at the contact surface between the third layer 265 and the ETL 270, good electron injection properties are obtained.

For example, the concentration of the first material in the first layer 261 may increase towards the second electrode 290 as it moves away from the first electrode 220. In addition, the concentration of the first material in the third layer 265 may decrease towards the second electrode 290 as it moves away from the first electrode 220.

For example, the concentration of the second material in the first layer 261 may decrease towards the second electrode 290 as it moves away from the first electrode 220.

For example, the concentration of each of the third and fourth materials in the third layer 265 may increase towards the second electrode 290 as it moves away from the first electrode 220.

Such an increase or decrease of concentration may result in a concentration gradient. In the case where the concentration of the first, second, third, or fourth material is changed, satisfactory hole blocking properties, thermal stability and electron injection properties are obtained.

Thus, the HBL 260 including the first layer 261, the second layer 263, and the third layer 265 blocks holes, is thermally stable, and stabilizes the flow of carriers by facilitating electron injection. Accordingly, an OLED including the structure described above may have high efficiency and long lifetime.

The constitution and manufacturing process of the OLED described above will now be described in more detail with reference to FIG. 1.

The substrate 110 may be any substrate generally used in organic light-emitting diodes, and may be a glass substrate or a transparent plastic substrate having good mechanical strength, thermal stability, transparency, surface smoothness, ease of handling, and waterproofness.

The first electrode 120 may be formed by applying a first electrode material on the substrate 110 by deposition or sputtering. When the first electrode 120 is an anode, the first electrode material may be selected from materials having a high work function so as to facilitate hole injection. The first electrode 120 may be a reflective electrode or a transparent electrode. Examples of the first electrode material may include indium-tin oxide (ITO), Indium-zinc-oxide (IZO), tin oxide (SnO$_2$), and zinc oxide (ZnO). Also, when magnesium (Mg), aluminum (Al), aluminum-lithium (Al—Li), calcium (Ca), magnesium-indium (Mg—In), or magnesium-silver (Mg—Ag) is used as the first electrode material, the first electrode 120 may be formed as a reflective electrode. The first electrode 120 may include two different materials. For example, the first electrode 120 may be formed as two layers of two different materials.

The HIL 130 is formed on the first electrode 120.

The HIL 130 may be formed on the first electrode 120 by various methods such as vacuum deposition, a wet process, or a laser transferring method. When the HIL 130 is formed by vacuum deposition, the deposition conditions may vary according to the compound used as the material for forming the HIL, the structure of the desired HIL, and thermal characteristics. For example, the deposition conditions may include, but are not limited to, a deposition temperature of about 100 to about 500° C., a degree of vacuum of about $10^{-8}$ to about $10^{-3}$ torr, and a deposition rate of about 0.01 to about 100 Å/sec.

When the HIL 130 is formed by spin coating as a wet process, the coating condition may vary according to the compound used as the material for forming the HIL, the structure of the desired HIL, and thermal characteristics. For example, the coating conditions may include, but are not limited to, a coating speed of about 2000 rpm to about 5000 rpm and a heat treatment temperature for removing solvent after coating of about 80 to about 200° C.

The material for forming the HIL 130 may be any known hole injection material. Examples of hole injection materials include, but are not limited to, a phthalocyanine compound such as copper phthalocyanine, m-MTDATA (refer to Formula below), TDATA (refer to Formula below), 2-TNATA (refer to Formula below), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), and polyaniline/poly(4-styrenesulfonate) (PANI/PSS).

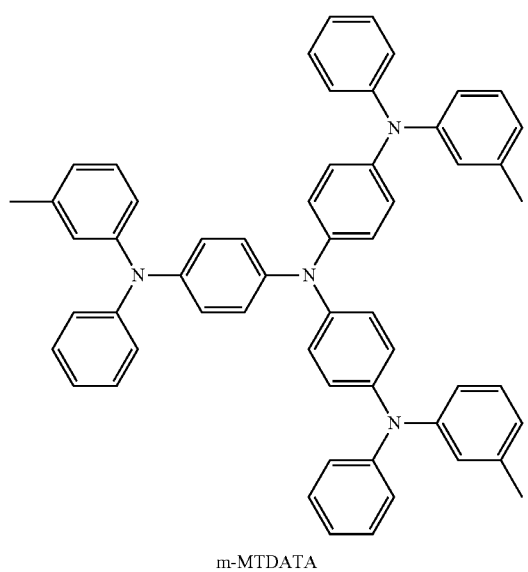

m-MTDATA

TDATA

2-TNATA

The thickness of the HIL 130 may be in the range of about 100 Å to about 10,000 Å, for example, in the range of about 100 Å to about 1,000 Å. When the thickness of the HIL is within these ranges, satisfactory hole injection properties may be obtained without a substantial increase in driving voltage.

Next, the HTL 140 may be formed on the HIL 130 by various methods such as vacuum deposition, a wet process, or a laser transferring method. When the HTL 140 is formed by vacuum deposition or spin coating, the deposition and coating conditions may vary according to the compound used. However, in general, the conditions may be substantially the same as the conditions for forming the HIL 130.

A material for forming the HTL 140 may be any known hole transporting material. Examples of the hole transporting material include TPD (refer to Formula below) and NPB (refer to Formula below).

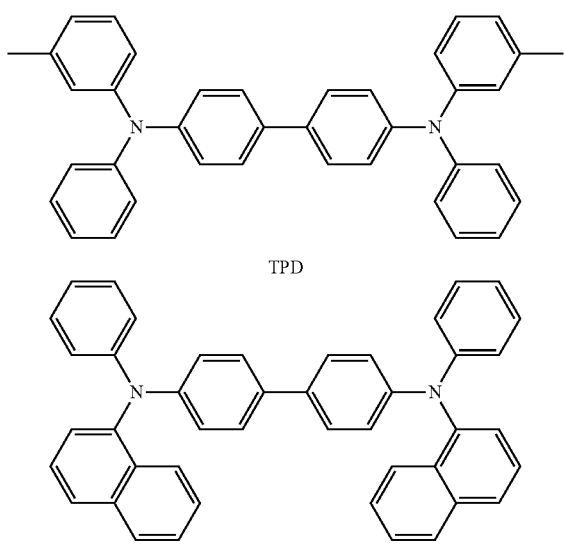

TPD

NPB

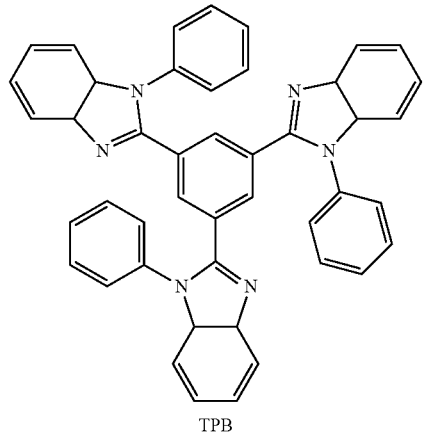

TPB

The thickness of the HTL 140 may be in the range of about 50 Å to about 1,000 Å, for example, in the range of about 100 Å to about 800 Å. When the thickness of the HTL 140 is within these ranges, satisfactory hole transport properties may be obtained without a substantial increase in driving voltage.

The EML 150 may be formed on the HTL 140 by various methods such as vacuum deposition, a wet process, or a laser transferring method. When the EML 150 is formed by vacuum deposition or spin coating, the deposition and coating conditions may vary according to the compounds. However, in general, the conditions may be substantially the same as the conditions for forming the HIL 130.

The EML 150 may include any known phosphorescent host, any known fluorescent host, any known phosphorescent dopant, or any known fluorescent dopant. Examples of the host may include, but are not limited to, 4,4'-N,N'-dicabazole-biphenyl (CBP), 9,10-di(naphthalene-2-yl)anthracene (ADN, refer to Formula below), TPBI (refer to Formula below), TBADN (refer to Formula below), E3 (refer to Formula below), distyrylarylene (DSA), and bis[2-(2-hydroxyphenyl)benzothiazolate]zinc (Zn(BTZ)$_2$).

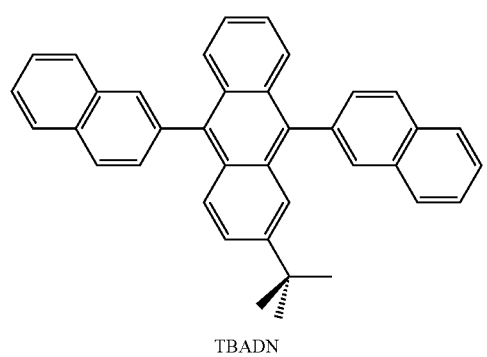

TBADN

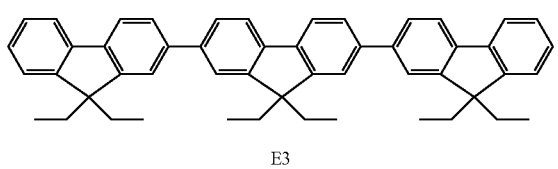

E3

Examples of a red dopant may include, but are not limited to, PtOEP (refer to Formula below), Ir(piq)$_3$ (refer to Formula below), and Btp$_2$Ir(acac) (refer to Formula below).

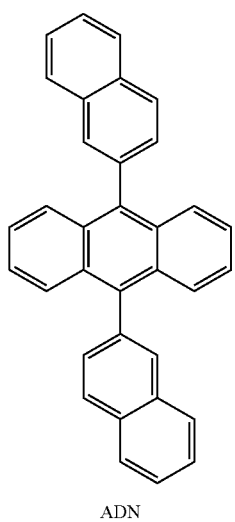

ADN

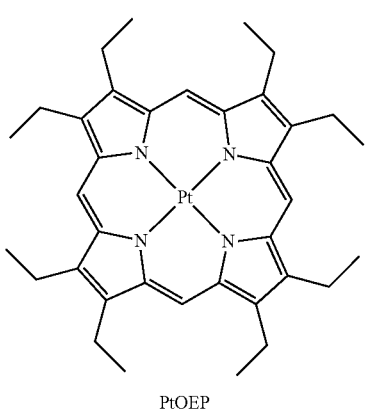

PtOEP

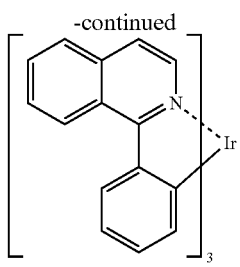

Ir(piq)₃

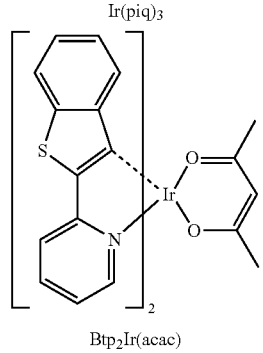

Btp₂Ir(acac)

Examples of a green dopant may include, but are not limited to, Ir(ppy)₃ (ppy=phenylpyridine, refer to Formula below), Ir(ppy)₂(acac) (refer to Formula below), and Ir(m-pyp)₃ (refer to Formula below).

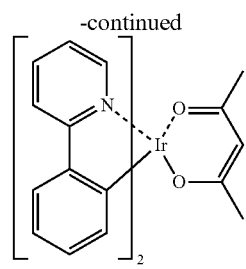

Ir(ppy)₂(acac)

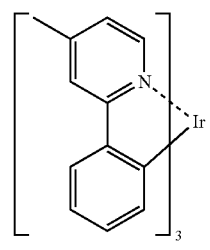

Ir(mpyp)₃

Examples of a blue dopant may include, but are not limited to, F₂Irpic (refer to Formula below), (F₂ppy)₂Ir(tmd) (refer to Formula below), Ir(dfppz)₃ (refer to Formula below), DPVBi (refer to Formula below), 4,4'-bis(4-diphenylaminosteril)biphenyl (DPAVBi) (refer to Formula below), and 2,5,8,11-tetra-tert-butylpherylene (TBPe) (refer to Formula below).

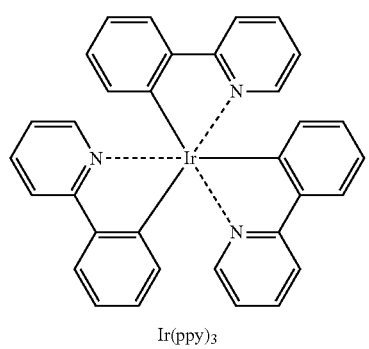

Ir(ppy)₃

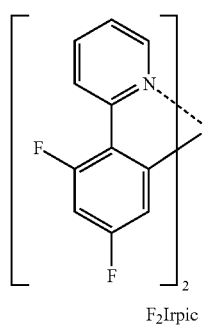

F₂Irpic

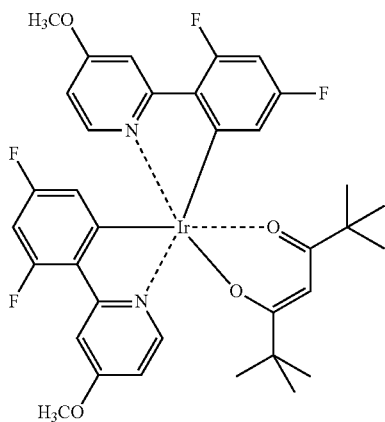

(F2ppy)2Ir(tmd)

-continued

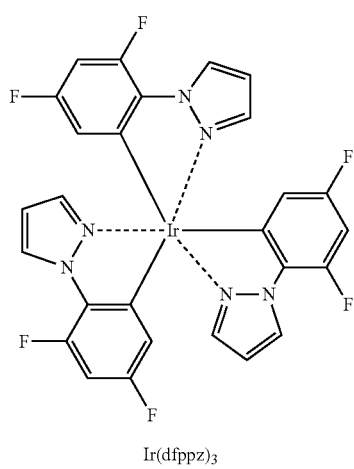

Ir(dfppz)₃

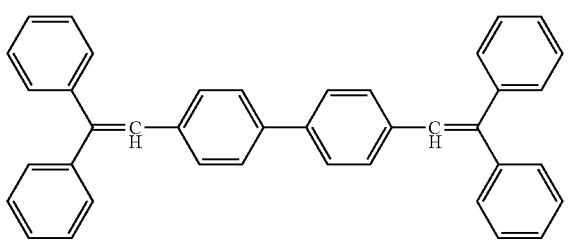

DPVBi

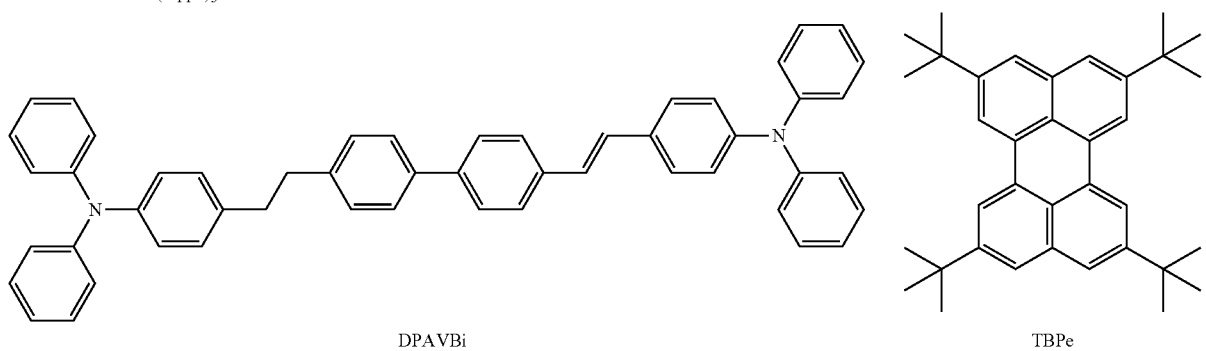

DPAVBi                                TBPe

When the EML 150 includes a host and a dopant, the amount of the dopant may generally be in the range of about 0.01 to about 15 parts by weight based on 100 parts by weight of the host; however, it is not limited thereto.

The thickness of the EML 150 may be in the range of about 100 Å to about 1,000 Å, for example, in the range of about 200 Å to about 600 Å. When the thickness of the EML 150 is within these ranges, good luminescent properties may be obtained without a substantial increase in driving voltage.

The HBL 160 is formed on the EML 150 by various methods such as vacuum deposition, a wet process, or a laser transferring method. When the HBL 160 is formed by vacuum deposition, the HBL 160 may be formed by preparing a first deposition source to deposit a first material in a first deposition region, and a second deposition source to deposit a second material in a second deposition region; positioning the first deposition source and the second deposition source at an interval, such that a first overlap region where the first deposition region and the second deposition region overlap each other is formed; and reciprocating the first deposition source and the second deposition source between an end and the other end of the EML 250.

When the first deposition source and the second deposition source are positioned at an interval such that a region from which the first material is discharged and a region from which the second material is discharged overlap each other, the first material and the second material are co-deposited when the deposition process is performed, and thus the first layer 161 including both the first material and the second material may be formed.

Next, the ETL 170 is formed on the HBL 160 by various methods such as vacuum deposition, a wet process, or a laser transferring method. A material for forming the ETL 170 may be any known electron transporting material. Examples of the electron transporting material may include, but are not limited to, a quinoline derivative such as tris(8-quinolinolate) aluminum ($Alq_3$), TAZ (refer to Formula below), BAlq (refer to Formula below), and beryllium bis(benzoquinolin-10-olate) ($Bebq_2$).

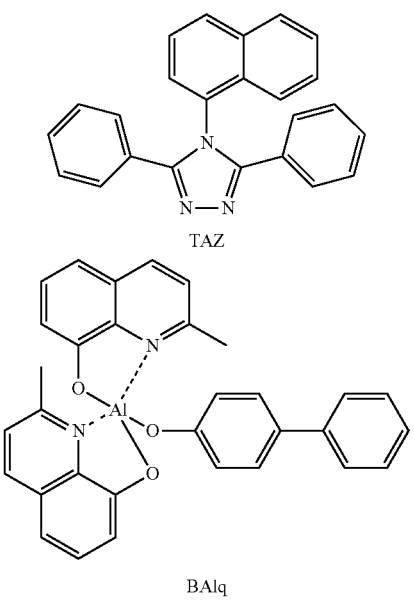

The thickness of the ETL 170 may be in the range of about 100 Å to about 1,000 Å, for example, in the range of about 150

Å to about 500 Å. When the thickness of the ETL 170 is within these ranges, satisfactory electron transport properties may be obtained without a substantial increase in driving voltage. When the ETL 170 is formed by vacuum deposition or spin coating, the deposition and coating conditions may vary according to the compound used. However, in general, the conditions may be substantially the same as the conditions for forming the HIL 130.

The EIL 180, which facilitates electron injection from the cathode, may be formed on the ETL 170. The material for forming the EIL 180 may be LiF, NaCl, CsF, $Li_2O$, or BaO. The deposition conditions for the EIL 180 may vary according to the compound used. However, in general, the conditions may be substantially the same as the conditions for forming the HIL 130.

The thickness of the EIL 180 may be in the range of about 1 Å to about 100 Å, for example, in the range of about 3 Å to about 90 Å. When the thickness of the EIL 180 is within these ranges, satisfactory electron injection properties may be obtained without a substantial increase in driving voltage.

The second electrode 190 is formed as a transparent electrode on the EIL 180. The second electrode 190 may be a cathode, which is an electron injection electrode. In this regard, a metal for forming the second electrode 190 may include a metal having a low work function, such as a metal, an alloy, an electric conducting compound, or a mixture thereof. In particular, the second electrode 190 may be formed as a thin film using lithium (Li), magnesium (Mg), aluminum (Al), aluminum-lithium (Al—Li), calcium (Ca), magnesium-indium (Mg—In), or magnesium-silver (Mg—Ag), thus being transparent. In order to obtain a top-emission type organic light-emitting diode, the second electrode 190 may be formed as a transparent electrode using ITO or IZO.

The organic light-emitting diode may be included in a flat display device including a transistor. Thus, according to another embodiment of the present invention, a flat display device includes a transistor including a source electrode, a drain electrode, a gate electrode, and an active layer; and the organic light-emitting diode described above, wherein one of the source electrode and the drain electrode is electrically connected to a first electrode of the organic light-emitting diode. The active layer of the transistor may be an amorphous silicon layer, a crystalline silicon layer, an organic semiconductor layer, an oxide semiconductor layer, or the like.

The term "substituted" when used to describe a particular substituent, for example, in "substituted or unsubstituted A" (where A is a specified substituent), indicates that at least one hydrogen atom of designated substituent is substituted with a substituent selected from a deuterium atom, a halogen atom, a hydroxyl group, a cyano group, a nitro group, a carboxyl group or a salt derivative thereof, a sulfonic acid group or a salt derivative thereof, a phosphoric acid group or a salt derivative thereof, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_3$-$C_{30}$ cycloalkyl group, a $C_3$-$C_{30}$ cycloalkenyl group, a $C_6$-$C_{30}$ aryl group, a $C_6$-$C_{30}$ aryloxy group, a $C_6$-$C_{30}$ arylthio group, a $C_3$-$C_{30}$ heteroaryl group, a group represented by $N(Q_{101})(Q_{102})$, and a group represented by $Si(Q_{103})(Q_{104})(Q_{105})$. In this regard, $Q_{101}$ through $Q_{105}$ may each be independently a hydrogen atom, a deuterium atom, a halogen atom, a hydroxyl group, a cyano group, an amino group, a nitro group, a carboxyl group, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_3$-$C_{30}$ cycloalkyl group, a $C_3$-$C_{30}$ cycloalkenyl group, a $C_6$-$C_{30}$ aryl group, a $C_6$-$C_{30}$ aryloxy group, a $C_6$-$C_{30}$ arylthio group, or a $C_3$-$C_{30}$ heteroaryl group.

For example, the term "substituted," as used herein, indicates that at least one hydrogen atom of the designated group is substituted with one selected from a deuterium atom, a halogen atom, a hydroxyl group, a cyano group, a nitro group, a carboxyl group, a methyl group, an ethyl group, a propyl group, a butyl group, a pentyl group, a phenyl group, a biphenyl group, a pentalenyl group, an indenyl group, a naphthyl group, an azulenyl group, a heptalenyl group, an indacenyl group, an acenaphthyl group, a fluorenyl group, a spiro-fluorenyl group, a phenalenyl group, a phenanthrenyl group, a phenanthridinyl group, a phenanthrolinyl group, an anthryl group, a fluoranthrenyl group, a triphenylenyl group, a pyrenyl group, a chrysenyl group, a naphthacenyl group, a picenyl group, a perylenyl group, a pentaphenyl group, a hexacenyl group, a pyrrolyl group, an imidazolyl group, a benzoimidazolyl group, a pyrazolyl group, a pyridinyl group, an imidazopyridinyl group, a pyrazinyl group, a pyrimidinyl group, an imidazopyrimidinyl group, a pyridazinyl group, an indolyl group, an isoindolyl group, a pyridoindolyl group, an indazolyl group, a purinyl group, a quinolinyl group, a benzoquinolinyl group, a phthalazinyl group, a naphthyridinyl group, a quinoxalinyl group, a quinazolinyl group, a carbazolyl group, a phenazinyl group, a furanyl group, a benzofuranyl group, a dibenzofuranyl group, a thiophenyl group, a benzothiophenyl group, a dibenzothiophenyl group, a thiazolyl group, an isothiazolyl group, a benzothiazolyl group, an oxazolyl group, a benzoxazolyl group, an isoxazolyl group, an oxadiazolyl group, a triazolyl group, a triazinyl group, a tetrazolyl group, a group represented by $N(Q_{101})(Q_{102})$, and a group represented by $Si(Q_{103})(Q_{104})(Q_{105})$.

The unsubstituted $C_1$-$C_{30}$ alkyl group denotes a saturated hydrocarbon group having a linear or branched structure in which one hydrogen atom is removed from the alkane. Examples of the unsubstituted $C_1$-$C_{30}$ alkyl group may include methyl, ethyl, propyl, isobutyl, sec-butyl, pentyl, isoamyl, hexyl, and the like. A detailed description of the substituents of the substituted $C_1$-$C_{30}$ alkyl group is provided above in the description of the term "substituted."

The unsubstituted $C_2$-$C_{30}$ alkenyl group denotes a group containing at least one carbon-to-carbon double bond at the middle or the end of an unsubstituted $C_2$-$C_{30}$ alkyl group. Examples of the unsubstituted $C_2$-$C_{30}$ alkenyl group may include ethenyl, propenyl, butenyl, pentenyl, hexenyl, heptenyl, octenyl, propadienyl, isoprenyl, allyl, and the like. A detailed description of the substituents of the substituted $C_2$-$C_{30}$ alkenyl group is provided above in the description of the term "substituted."

The unsubstituted $C_2$-$C_{30}$ alkynyl group denotes a group containing at least one carbon-to-carbon triple bond at the middle or the end of an unsubstituted $C_2$-$C_{60}$ alkyl group. The unsubstituted $C_2$-$C_{30}$ alkynyl group may be acetylenyl. A detailed description of the substituents of the substituted $C_2$-$C_{30}$ alkynyl group is provided above in the description of the term "substituted."

The unsubstituted $C_1$-$C_{30}$ alkoxy group has the Formula —OY (Y is an unsubstituted $C_1$-$C_{30}$ alkyl group) and may be, for example, methoxy, ethoxy, isopropyloxy, butoxy, pentoxy, and the like. A detailed description of the substituents of the substituted $C_1$-$C_{30}$ alkoxy group is provided above in the description of the term "substituted."

The unsubstituted $C_3$-$C_{30}$ cycloalkyl group denotes a ring-type saturated hydrocarbon group and may be, for example, cyclopropyl, cyclobutyl, cyclopentyl, cyclohexyl, cycloctyl, and the like. A detailed description of the substituents of the substituted $C_3$-$C_{30}$ cycloalkyl group is provided above in the description of the term "substituted."

The unsubstituted $C_3$-$C_{30}$ cycloalkenyl group denotes a ring-type unsaturated hydrocarbon group which has at least one carbon-to-carbon double bond and is not an aromatic ring. Examples of the unsubstituted $C_3$-$C_{30}$ cycloalkenyl group may include cyclopropenyl, cyclobutenyl, cyclopentenyl, cyclohexenyl, cycloheptenyl, a 1,3-cyclohexadienyl group, a 1,4-cyclohexadienyl group, a 2,4-cycloheptadienyl group, a 1,5-cyclooctadienyl group, and the like. A detailed description of the substituents of the substituted $C_3$-$C_{60}$ cycloalkenyl group is provided above in the description of the term "substituted."

The unsubstituted $C_6$-$C_{30}$ aryl group denotes a monovalent group having a $C_6$-$C_{30}$ carbocyclic aromatic system, wherein the monovalent group may be a monocyclic or polycyclic group. In the polycyclic group, at least two rings included therein may be fused with each other. Examples of the unsubstituted $C_6$-$C_{30}$ aryl group may include phenyl, pentalenyl, indenyl, naphthyl, azulenyl, heptalenyl, indacenyl, acenaphthyl, fluorenyl, spiro-fluorenyl, phenalenyl, phenanthrenyl, anthryl, fluoranthrenyl, triphenylenyl, pyrenyl, chrysenyl, naphthacenyl, picenyl, perylenyl, pentaphenyl, hexacenyl, and the like. A detailed description of the substituent of the substituted $C_6$-$C_{30}$ aryl group is provided above in the description of the term "substituted."

The unsubstituted $C_6$-$C_{30}$ aryloxy group denotes a monovalent group to which carbon atoms of the $C_6$-$C_{30}$ aryl group are attached through an oxygen linking group (—O—). A detailed description of the substituents of the substituted $C_6$-$C_{30}$ aryloxy group is provided above in the description of the term "substituted."

The unsubstituted $C_6$-$C_{30}$ arylthio group denotes a monovalent group to which carbon atoms of the $C_6$-$C_{30}$ aryl group are attached through a sulfur linking group (—S—). Examples of the unsubstituted $C_6$-$C_{30}$ arylthio group may include phenylthio, naphthylthio, indanylthio, and indenylthio. A detailed description of the substituents of the substituted $C_6$-$C_{30}$ arylthio group is provided above in the description of the term "substituted."

The unsubstituted $C_3$-$C_{30}$ heteroaryl group denotes a monovalent group including at least one ring containing at least one heteroatom selected from N, O, P, and S, wherein the monovalent group is monocyclic or polycyclic. In the polycyclic group, at least two rings included therein may be fused with each other. Examples of the unsubstituted $C_3$-$C_{30}$ heteroaryl group may include pyrrolyl, imidazolyl, pyrazolyl, pyridinyl, pyrazinyl, pyrimidinyl, pyridazinyl, isoindolyl, indolyl, indazolyl, purinyl, quinolinyl, benzoquinolinyl, phthalazinyl, naphthyridinyl, quinoxalinyl, quinazolinyl, cinnolinyl, carbazolyl, phenanthridinyl, acridinyl, phenanthrolinyl, phenazinyl, benzoxazolyl, benzoimidazolyl, furanyl, benzofuranyl, thiophenyl, benzothiophenyl, thiazolyl, isothiazolyl, benzothiazolyl, isoxazolyl, oxazolyl, triazolyl, tetrazolyl, oxadiazolyl, triazinyl, benzoxazolyl, and the like. A detailed description of the substituents of the substituted $C_3$-$C_{30}$ heteroaryl group is provided above in the description of the term "substituted."

The unsubstituted $C_1$-$C_{30}$ alkylene group denotes a divalent group having a linear or branched structure in which two hydrogen atoms are removed from the alkane. Examples of the unsubstituted $C_1$-$C_{30}$ alkylene group are provided above in the description of the unsubstituted $C_1$-$C_{30}$ alkyl group. A detailed description of the substituents of the substituted $C_1$-$C_{30}$ alkylene group is provided above in the description of the term "substituted."

The unsubstituted $C_6$-$C_{30}$ arylene group may denote a divalent group having a $C_6$-$C_{30}$ carbocyclic aromatic system, wherein the divalent group may be a monocyclic or polycyclic group. Examples of the unsubstituted $C_6$-$C_{30}$ arylene group are provided above in the description of the unsubstituted $C_6$-$C_{30}$ aryl group. A detailed description of the substituents of the substituted $C_6$-$C_{30}$ arylene group is provided above in the description of the term "substituted."

The unsubstituted $C_3$-$C_{30}$ heteroarylene group denotes a divalent group with 3 to 30 carbon atoms which includes at least one ring containing at least one heteroatom selected from N, O, P, and S, wherein the monovalent group is monocyclic or polycyclic. Examples of the unsubstituted $C_3$-$C_{30}$ heteroarylene group are provided above in the description of the unsubstituted $C_3$-$C_{30}$ heteroaryl group. A detailed description of the substituents of the substituted $C_3$-$C_{30}$ heteroarylene group is provided above in the description of the term "substituted."

An organic light-emitting diode according to an embodiment of the present invention will now be described in more detail with reference to the following Examples. These Examples are presented for illustrative purposes only and are not intended to limit the scope of the invention.

Example 1

As a first electrode, a 15 $\Omega$/cm$^2$ (1200 Å) ITO glass substrate (available from Corning Co. Ltd) was cut to a size of 50 mm×50 mm×0.7 mm, ultrasonically washed with isopropyl alcohol and pure water each for 5 minutes, and then washed with UV ozone for 30 minutes. Then, m-MTDATA was vacuum deposited on the ITO electrode to form a HIL having a thickness of 750 Å, and NPB was vacuum deposited on the HIL to form a HTL having a thickness of 150 Å. Subsequently, 92 wt % of Zn(BTZ)$_2$ as a host and 8 wt % of Ir(piq)$_3$ as a dopant were deposited on the HTL to form a red EML having a thickness of 300 Å.

Thereafter, a process of reciprocating deposition sources once by using BCP as a first material and CBP as a second material was performed on the red EML to form a HBL that included a first layer including BCP and CBP at a weight ratio of 1 to 1 and having a thickness of 50 Å and a second layer formed of BCP and having a thickness of 50 Å.

The concentration of BCP included in the first layer was increased towards the second layer as it moved away from the EML, and the concentration of CBP in the first layer was decreased towards the second layer as it moved away from the EML.

Next, aluminum tris(8-hydroxyquinoline) (Alq$_3$) was vacuum deposited on the HBL to form an ETL having a thickness of 300 Å.

Then, LiF was vacuum deposited on the ETL to form an EIL having a thickness of 80 Å, and Al was vacuum deposited on the EIL to form a cathode having a thickness of 3000 Å, thereby completing the manufacturing of an OLED.

Example 2

An OLED was manufactured in the same manner as in Example 1, except that the process of reciprocating deposition sources once used Balq as a first material, CBP as a second material, Compound 2 above as a third material, and LIQ as a fourth material to form a HBL that included a first layer including Balq and CBP at a weight ratio of 1 to 1 and having a thickness of 40 Å, a second layer formed of Balq and having a thickness of 40 Å and a third layer including Balq, Compound 2 and LiQ at a weight ratio of 1 to 1 to 0.5 and having a thickness of 20 Å, the concentration of Balq in the first layer was increased towards the second layer from the EML, the concentration of CBP in the first layer was decreased towards the second layer from the EML, the concentration of Balq in the third layer was decreased from the second layer towards the ETL (which will be formed later), and the concentration of each of Compound 2 and LiQ was increased towards the ETL as it moved away from the second layer.

Comparative Example 1

An OLED was manufactured in the same manner as in Example 1, except that when the HBL was formed on the red EML, the HBL having a thickness of 100 Å was formed using only BCP.

Comparative Example 2

An OLED was manufactured in the same manner as in Example 1, except that when the HBL was formed on the red EML, the HBL was formed by forming a layer using BCP to a thickness of 50 Å and forming a layer using CBP on the BCP layer to a thickness of 50 Å.

Comparative Example 3

An OLED was manufactured in the same manner as in Example 1, except that when the HBL was formed on the red EML, BCP and CBP were co-deposited on the red EML at a weight ratio of 1 to 1 to form the HBL having a thickness of 100 Å.

Comparative Example 4

An OLED was manufactured in the same manner as in Example 1, except that when the HBL was formed on the red EML, BCP, CBP, and Compound 2 above were co-deposited on the red EML at a weight ratio of 1 to 1 to 0.5 to form the HBL having a thickness of 360 Å.

Evaluation Example

The luminous efficiency of each of the OLEDs manufactured according to Examples 1 and 2 and Comparative Examples 1 through 4 was measured using a PR650 (Spectroscan) Source Measurement Unit (manufactured by PhotoResearch), and the lifetime thereof (time spent when luminance is reduced at a current density of 100 mA/cm$^2$) was evaluated. The results are shown in Table 1 below and FIG. 3.

TABLE 1

| | HBL | Luminous efficiency (cd/A) |
|---|---|---|
| Example 1 | First layer + second layer | 62 |
| Example 2 | First layer + second layer + third layer | 68 |
| Comparative Example 1 | Single layer | 60 |
| Comparative Example 2 | Single layer + single layer | — |
| Comparative Example 3 | Mixing layer | — |
| Comparative Example 4 | Mixing layer | 40 |

Referring to Table 1 above, the OLEDs of Examples 1 and 2 have higher luminous efficiency, as compared to the OLEDs of Comparative Examples 1 through 4.

Figure 3:
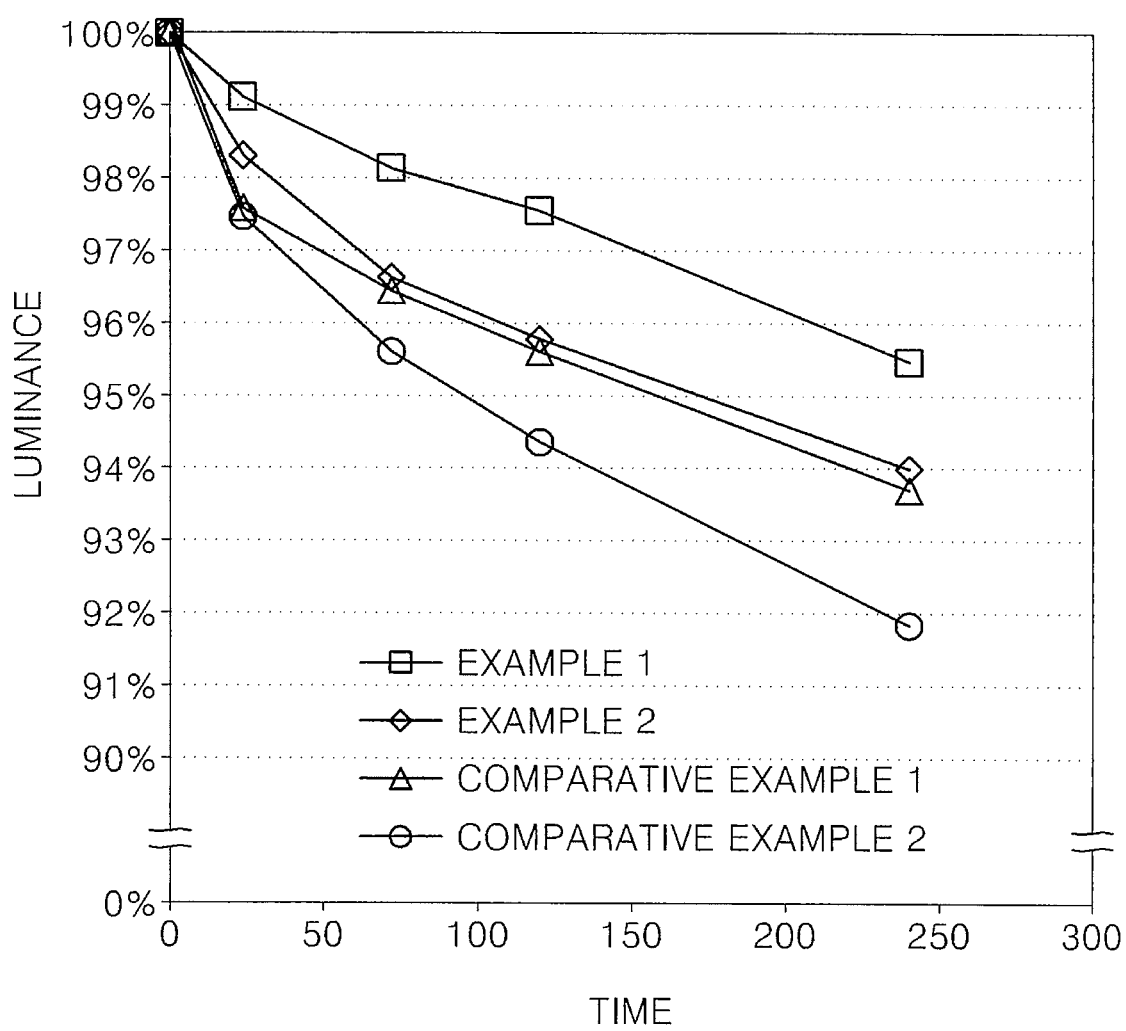
FIG. 3 is a graph of luminance according to time of an OLED according to an embodiment.

In addition, referring to FIG. 3, the OLEDs of Examples 1 and 2 have longer lifetime than the OLEDs of Comparative Examples 1 through 4.

It is confirmed that the HBL of each of the OLEDs of Examples 1 and 2 reduces the interface barrier between the HBL and the EML and the interface barrier between the HBL and the ETL, and thus carriers are accumulated in the interfaces, which results in enhanced efficiency and lifetime.

As described above, according to one or more embodiments of the present invention, by reducing the interface barrier of the HBL, the OLED has high efficiency and a long lifetime, and a flat display device including the OLED exhibits improved performance.

While the present invention has been illustrated and described with reference to exemplary embodiments, it is understood by those of ordinary skill in the art that various changes and modifications may be made to the described embodiments without departing from the spirit and scope of the present invention, as defined by the following claims.

What is claimed is:

1. An organic light-emitting diode comprising:
a substrate;
a first electrode;
a second electrode;
an emission layer between the first electrode and the second electrode; and
a hole blocking layer between the emission layer and the second electrode,
wherein the hole blocking layer comprises:
a first layer comprising a first material and a second material, the first material comprising a hole blocking material having a highest occupied molecular orbital (HOMO) energy level in a range of about 5.5 to about 6.9 eV, and the second material comprises a green or red phosphorescent host material selected from the group consisting of carbazole derivatives, phenanthroline derivatives, triazole derivatives, and combinations thereof, and
a second layer on the first layer and comprising the first material.

2. The organic light-emitting diode of claim 1, wherein the first material comprises at least one selected from the group consisting of 2-biphenyl-4-yl-5-(4-t-butylphenyl)-1,3,4-oxadiazole (PBD), 3-phenyl-4-(1'-naphthyl)-5-phenyl-1,2,4-triazole (TAZ), 2,9-dimethyl-4,7-diphenyl-1,10-phenanthroline (BCP), 2,2',2"-(1,3,5-benzenetriyl)tris-[1-phenyl-1H-benzimidazole] (TPBI), N-2,6-dibromophenyl-1,8-naphthalimide (niBr), bis(2-methyl-8-quinolato)-(p-phenylphenolato)-aluminum (Balq), aluminium(III)bis(2-methyl-8-quinolinolato)4-phenolate (Palq), and aluminium (III)bis(2-methyl-8-quinolinolato)triphenylsilanolate (Salq).

3. The organic light-emitting diode of claim 1, wherein the second material comprises at least one selected from the group consisting of 4,4-N,N'-dicarbazole-biphenyl (CBP), N,N'-dicarbazolyl-3,5-benzene (mCP), 4,4',4"-tris(9-carbazolyl)triphenylamine, 4,4'-bis(9-carbazolyl)-2,2'-dimethylbiphenyl, 3-phenyl-4-(1'-naphthyl)-5-phenylcarbazole, and 2,9-dimethyl-4,7-diphenyl-1,10-phenathroline (BCP).

4. The organic light-emitting diode of claim 1, wherein a thickness of each of the first layer and the second layer is independently in a range of about 5 Å to about 200 Å.

5. The organic light-emitting diode of claim 1, wherein an amount of the first material in the first layer is in a range of about 30 to about 70 parts by weight based on 100 parts by weight of the first layer, and an amount of the second material in the first layer is in a range of about 30 to about 70 parts by weight based on 100 parts by weight of the first layer.

6. The organic light-emitting diode of claim 1, wherein a concentration of the first material in the first layer decreases towards the first electrode and increases towards the second electrode.

7. The organic light-emitting diode of claim 1, wherein a concentration of the second material in the first layer increases towards the first electrode and decreases towards the second electrode.

8. The organic light-emitting diode of claim 1, further comprising at least one additional layer between the first electrode and the second electrode, the at least one additional layer being selected from the group consisting of a hole injection layer, a hole transport layer, an electron transport layer, and an electron injection layer.

9. The organic light-emitting diode of claim 1, further comprising a third layer formed on the second layer and comprising the first material, a third material, and a fourth material,
wherein the third material comprises at least one selected from the group consisting of Compound 1, a compound represented by Formula 1, and a compound represented by Formula 2, and the fourth material comprises an electron injection material:

Compound 1

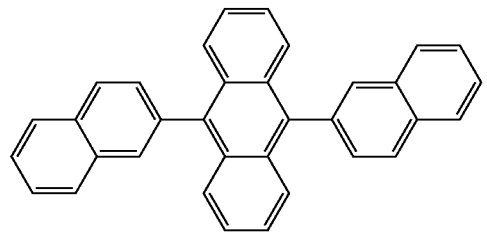

Formula 1

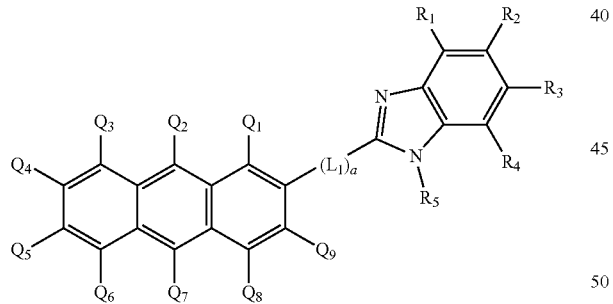

Formula 2

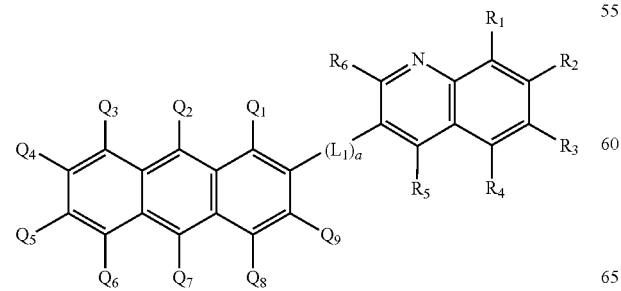

wherein each of $R_1$ through $R_6$ is independently selected from the group consisting of hydrogen, a halogen atom, a hydroxyl group, a cyano group, a substituted or unsubstituted $C_1$-$C_{30}$ alkyl group, a substituted or unsubstituted $C_1$-$C_{30}$ alkoxy group, a substituted or unsubstituted $C_1$-$C_{30}$ acyl group, a substituted or unsubstituted $C_2$-$C_{30}$ alkenyl group, a substituted or unsubstituted $C_2$-$C_{30}$ alkynyl group, a substituted or unsubstituted $C_6$-$C_{30}$ aryl group, or a substituted or unsubstituted $C_3$-$C_{30}$ heteroaryl group, wherein at least two adjacent groups selected from $R_1$ through $R_6$ are optionally linked to each other to form a saturated or unsaturated ring;

$L_1$ is a single bond, a substituted or unsubstituted $C_1$-$C_{30}$ alkylene group, a substituted or unsubstituted $C_6$-$C_{30}$ arylene group, or a substituted or unsubstituted $C_3$-$C_{30}$ heteroarylene group;

each of $Q_1$ through $Q_9$ is independently hydrogen, a substituted or unsubstituted $C_6$-$C_{30}$ aryl group, or a substituted or unsubstituted $C_3$-$C_{30}$ heteroaryl group; and a is an integer of 1 to 10.

10. The organic light-emitting diode of claim 9, wherein the third material comprises at least one of Compounds 1 through 3:

Compound 1

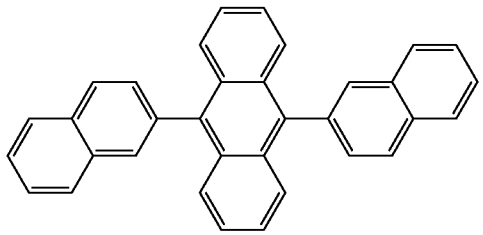

Compound 2

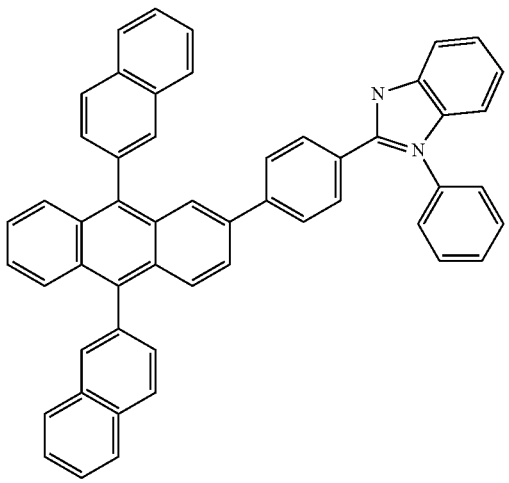

Compound 3

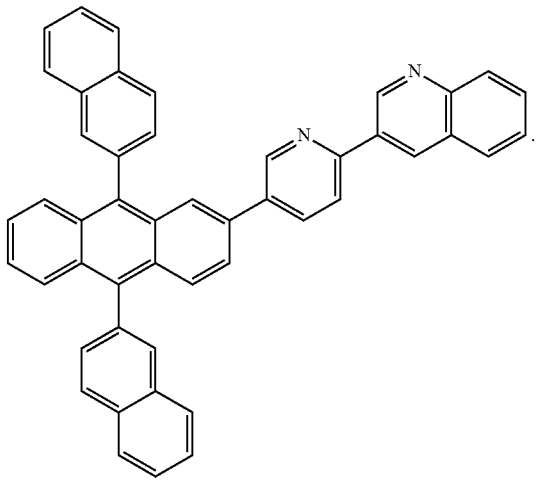

11. The organic light-emitting diode of claim 9, wherein the fourth material comprises at least one selected from the group consisting of LiQ, LiF, NaCl, CsF, Li$_2$O, BaO, and BaF$_2$.

12. The organic light-emitting diode of claim 9, wherein the fourth material comprises lithium quinolate (LiQ).

13. The organic light-emitting diode of claim 9, wherein the first layer, the second layer, and the third layer each have a thickness in a range of about 3 Å to about 150 Å.

14. The organic light-emitting diode of claim 9, wherein an amount of the first material in the first layer is in a range of about 30 to about 70 parts by weight based on 100 parts by weight of the first layer, an amount of the second material in the first layer is in a range of about 30 to about 70 parts by weight based on 100 parts by weight of the first layer, an amount of the first material in the third layer is in a range of about 30 to about 70 parts by weight based on 100 parts by weight of the third layer, an amount of the third material in the third layer is in a range of about 15 to about 35 parts by weight based on 100 parts by weight of the third layer, and an amount of the fourth material in the third layer is in a range of about 15 to about 35 parts by weight based on 100 parts by weight of the third layer.

15. The organic light-emitting diode of claim 9, wherein a concentration of the first material in the first layer decreases towards the first electrode and increases towards the second electrode, and a concentration of the first material in the third layer increases towards the first electrode and decreases towards the second electrode.

16. The organic light-emitting diode of claim 9, wherein a concentration of the second material in the first layer increases towards the first electrode and decreases towards the second electrode.

17. The organic light-emitting diode of claim 9, wherein a concentration of each of the third material and the fourth material in the third layer decreases towards the first electrode and increases towards the second electrode.

18. The organic light-emitting diode of claim 9, further comprising at least one additional layer between the first electrode and the second electrode, the at least one additional layer being selected from the group consisting of a hole injection layer, a hole transport layer, an electron transport layer, and an electron injection layer.

19. A flat display device comprising:
    a transistor comprising a source electrode, a drain electrode, a gate electrode, and an active layer; and
    the organic light-emitting diode according to claim 1, wherein one of the source electrode or the drain electrode is electrically connected to the first electrode of the organic light-emitting diode.

* * * * *